(12) United States Patent
Fan et al.

(10) Patent No.: US 12,094,981 B2
(45) Date of Patent: Sep. 17, 2024

(54) DISPLAY DEVICE INCLUDING ACTIVE ELEMENT COMPRISING TFTS WITH GATE INSULATING LAYERS HAVING THICKNESSES OPTIMIZED TO MAINTAIN SUBTHRESHOLD SWING, AND MANUFACTURING METHOD THEREOF

(71) Applicant: Au Optronics Corporation, Hsinchu (TW)

(72) Inventors: Yang-Shun Fan, Hsinchu (TW); Chen-Shuo Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 546 days.

(21) Appl. No.: 17/511,568

(22) Filed: Oct. 27, 2021

(65) Prior Publication Data

US 2022/0231170 A1 Jul. 21, 2022

(30) Foreign Application Priority Data

Jan. 15, 2021 (TW) .................................. 110101700

(51) Int. Cl.
*H01L 29/786* (2006.01)
*H01L 29/66* (2006.01)

(52) U.S. Cl.
CPC ...... *H01L 29/7869* (2013.01); *H01L 29/6675* (2013.01); *H01L 29/78672* (2013.01); *H01L 29/78696* (2013.01)

(58) Field of Classification Search
CPC ........... H01L 29/42384; H01L 29/6675; H01L 29/74672; H01L 29/7869; H01L 29/78696; H01L 2029/42388

USPC ......................................................... 257/288
See application file for complete search history.

(56) References Cited

U.S. PATENT DOCUMENTS

| | | | |
|---|---|---|---|
| 5,644,147 | A | 7/1997 | Yamazaki et al. |
| 5,818,070 | A | 10/1998 | Yamazaki et al. |
| 9,768,204 | B2 | 9/2017 | Lin et al. |
| 10,192,897 | B2 | 1/2019 | Lin et al. |
| 10,276,606 | B2 | 4/2019 | Lin et al. |

(Continued)

FOREIGN PATENT DOCUMENTS

| | | |
|---|---|---|
| CN | 105280141 | 1/2016 |
| CN | 109817645 | 3/2021 |

(Continued)

*Primary Examiner* — Matthew E. Gordon
(74) *Attorney, Agent, or Firm* — JCIPRNET

(57) ABSTRACT

An active element and a manufacturing method thereof are provided. The active element includes a substrate, a switching bottom gate and a driving bottom gate disposed on the substrate, a first gate insulating layer disposed on the substrate and covering the switching bottom gate and the driving bottom gate, a switching channel and a driving channel disposed on the first gate insulating layer, a second gate insulating layer disposed on the first gate insulating layer and covering the switching channel and the driving channel, and a switching top gate and a driving top gate disposed on the second gate insulating layer. The driving channel has a low potential end electrically connected to the driving bottom gate. A thickness of the second gate insulating layer is greater than a thickness of the first gate insulating layer. The switching top gate is electrically connected to the switching bottom gate.

20 Claims, 3 Drawing Sheets

(56) References Cited

U.S. PATENT DOCUMENTS

| | | | |
|---|---|---|---|
| 10,319,752 B2 | 6/2019 | Kao et al. | |
| 10,978,498 B2 | 4/2021 | Lin et al. | |
| 2015/0243718 A1* | 8/2015 | Kwon | H10K 59/131 |
| | | | 257/43 |
| 2015/0243720 A1* | 8/2015 | Kwon | H01L 27/1251 |
| | | | 257/40 |
| 2017/0084636 A1 | 3/2017 | Lin et al. | |
| 2017/0084639 A1 | 3/2017 | Kao et al. | |
| 2017/0084641 A1 | 3/2017 | Lin et al. | |
| 2017/0084642 A1 | 3/2017 | Lin et al. | |
| 2018/0006065 A1 | 1/2018 | Lin et al. | |
| 2019/0109160 A1 | 4/2019 | Lin et al. | |
| 2019/0252418 A1 | 8/2019 | Kao et al. | |
| 2022/0310731 A1* | 9/2022 | Chen | H01L 29/78696 |

FOREIGN PATENT DOCUMENTS

| | | |
|---|---|---|
| JP | H0823100 | 1/1996 |
| TW | I606289 | 11/2017 |

* cited by examiner

DISPLAY DEVICE INCLUDING ACTIVE ELEMENT COMPRISING TFTS WITH GATE INSULATING LAYERS HAVING THICKNESSES OPTIMIZED TO MAINTAIN SUBTHRESHOLD SWING, AND MANUFACTURING METHOD THEREOF

CROSS-REFERENCE TO RELATED APPLICATION

This application claims the priority benefit of Taiwan application serial no. 110101700, filed on Jan. 15, 2021. The entirety of the above-mentioned patent application is hereby incorporated by reference herein and made a part of this specification.

BACKGROUND

Technical Field

The disclosure relates to an element and a manufacturing method thereof, and particularly relates to an active element and a manufacturing method thereof.

Description of Related Art

A light-emitting element array display device is composed of a plurality of light-emitting elements arranged in an array disposed on a substrate. Inheriting properties of the current light-emitting elements, the light-emitting element array display device is power saving, and has high efficiency, high brightness, fast response speed, etc. In order to drive the light-emitting elements, a low temperature poly-silicon (LTPS) thin film transistor is often used as a driving element, accompanied by an indium-gallium-zinc oxide (IGZO) thin film transistor used as a switching element. However, if the used LTPS thin film transistor has a relatively low subthreshold swing, when a display brightness value is relatively low, the brightness is likely to be changed because of a current change, which reduces the display quality. In addition, if the used IGZO thin film transistor has a relatively high a subthreshold swing, then a switching speed is relatively slow, which may result in image lag.

SUMMARY

The disclosure is directed to an active element and a manufacturing method thereof, in which poor display quality is improved.

The disclosure provides an active element including a substrate, a switching bottom gate, a driving bottom gate, a first gate insulating layer, a switching channel, a driving channel, a second gate insulating layer, a switching top gate, and a driving top gate. The switching bottom gate and the driving bottom gate are disposed on the substrate. The first gate insulating layer is disposed on the substrate and covers the switching bottom gate and the driving bottom gate. The switching channel and the driving channel are disposed on the first gate insulating layer. The driving channel has a low potential end. The low potential end is electrically connected to the driving bottom gate. The second gate insulating layer is disposed on the first gate insulating layer and covers the switching channel and the driving channel. A thickness of the second gate insulating layer is greater than a thickness of the first gate insulating layer. The switching top gate and the driving top gate are disposed on the second gate insulating layer. The switching top gate is electrically connected to the switching bottom gate.

In an embodiment of the disclosure, the thickness of the second gate insulating layer is greater than or equal to 4 times of the thickness of the first gate insulating layer.

In an embodiment of the disclosure, the thickness of the second gate insulating layer is equal to 5 times of the thickness of the first gate insulating layer.

In an embodiment of the disclosure, a material of the switching channel is indium-gallium-zinc oxide (IGZO).

In an embodiment of the disclosure, a material of the driving channel is low temperature poly-silicon.

In an embodiment of the disclosure, a thickness of a part of the first gate insulating layer between the switching bottom gate and the switching channel is formed to be equal to a thickness of a part of the first gate insulating layer between the driving bottom gate and the driving channel.

In an embodiment of the disclosure, a thickness of a part of the second gate insulating layer between the switching bottom gate and the switching channel is formed to be equal to a thickness of a part of the second gate insulating layer between the driving bottom gate and the driving channel.

In an embodiment of the disclosure, a part of the switching channel is doped with hydrogen ions.

In an embodiment of the disclosure, a part of the driving channel is doped with phosphorus ions or arsenic ions.

In an embodiment of the disclosure, the active element further includes a passivation layer disposed on the second gate insulating layer and covering the switching top gate and the driving top gate.

The disclosure provides a manufacturing method of an active element including following steps. A switching bottom gate and a driving bottom gate are formed on a substrate. A first gate insulating layer is formed on the substrate. The first gate insulating layer covers the switching bottom gate and the driving bottom gate. A switching channel and a driving channel are formed on the first gate insulating layer. A second gate insulating layer is formed on the first gate insulating layer. The second gate insulating layer covers the switching channel and the driving channel. A thickness of the second gate insulating layer is greater than a thickness of the first gate insulating layer. A switching top gate and a driving top gate are formed on the second gate insulating layer, and the switching top gate is electrically connected to the switching bottom gate, and a low potential end of the driving channel is electrically connected to the driving bottom gate.

In an embodiment of the disclosure, the thickness of the second gate insulating layer is formed to be greater than or equal to 4 times of the thickness of the first gate insulating layer.

In an embodiment of the disclosure, the thickness of the second gate insulating layer is formed to be equal to 5 times of the thickness of the first gate insulating layer.

In an embodiment of the disclosure, a material of the switching channel is indium-gallium-zinc oxide (IGZO).

In an embodiment of the disclosure, a material of the driving channel is low temperature poly-silicon.

In an embodiment of the disclosure, a thickness of a part of the first gate insulating layer between the switching bottom gate and the switching channel is equal to a thickness of a part of the first gate insulating layer between the driving bottom gate and the driving channel.

In an embodiment of the disclosure, a thickness of a part of the second gate insulating layer between the switching bottom gate and the switching channel is equal to a thickness of a part of the second gate insulating layer between the driving bottom gate and the driving channel.

In an embodiment of the disclosure, the manufacturing method of the active element further includes performing a doping process to dope a part of the switching channel with hydrogen ions after forming the switching top gate and the driving top gate.

In an embodiment of the disclosure, the manufacturing method of the active element further includes performing a doping process to dope a part of the driving channel with phosphorus ions or arsenic ions after forming the switching top gate and the driving top gate.

In an embodiment of the disclosure, the manufacturing method of the active element further includes forming a passivation layer on the second gate insulating layer after forming the switching top gate and the driving top gate, where the passivation layer covers the switching top gate and the driving top gate.

Based on the above description, in the active element and the manufacturing method thereof of the disclosure, not only the subthreshold swing of the driving element is maintained higher, but also the subthreshold swing of the switching element is reduced, thereby improving the display quality.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

FIG. 1 to FIG. 4 are cross-sectional views of flows of a manufacturing method of an active element according to an embodiment of the disclosure. Referring to 1, the manufacturing method of the active element of the embodiment is to first form a switching bottom gate G12 and a driving bottom gate G22 on a substrate 110. When forming the switching bottom gate G12 and the driving bottom gate G22, for example, a conductor layer is formed first, and then the conductor layer is patterned to form the switching bottom gate G12 and the driving bottom gate G22. Then, a first gate insulating layer 120 is formed on the substrate 110. The first gate insulating layer 120 covers the switching bottom gate G12 and the driving bottom gate G22. A material of the first gate insulating layer 120 is, for example, a dielectric material such as silicon oxide, silicon nitride, or silicon oxynitride.

Then, a switching channel C10 and a driving channel C20 are formed on the first gate insulating layer 120. In the embodiment, a material of the switching channel C10 is indium-gallium-zinc oxide, and a material of the driving channel C20 is low temperature poly-silicon, but the disclosure is not limited thereto. For example, a material of the switching channel C10 may also be zinc oxide (ZnO), tin oxide (SnO), indium-zinc oxide (IZO), gallium-zinc oxide (GZO), zinc-tin oxide (ZTO), indium-tin Oxide (ITO) or other suitable metal oxide semiconductor materials. When the materials of the switching channel C10 and the driving channel C20 are different, the switching channel C10 and the driving channel C20 may be formed separately one after another.

Figure 1:
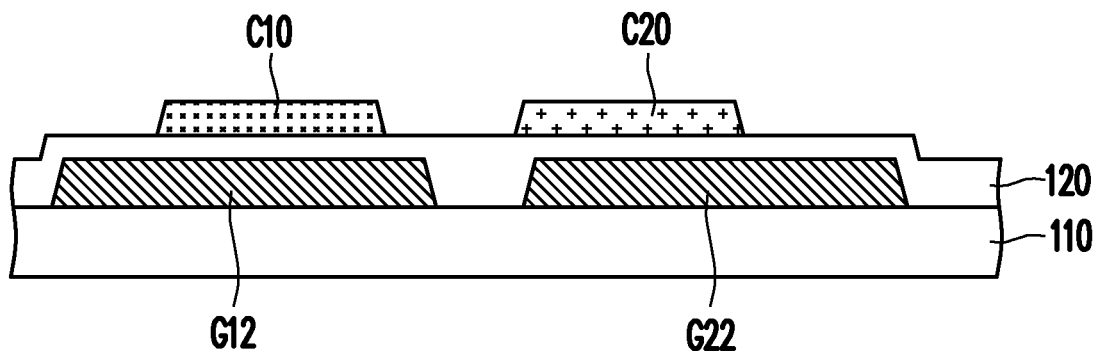
FIG. 1 to FIG. 4 are cross-sectional views of flows of a manufacturing method of an active element according to an embodiment of the disclosure.
Figure 2:
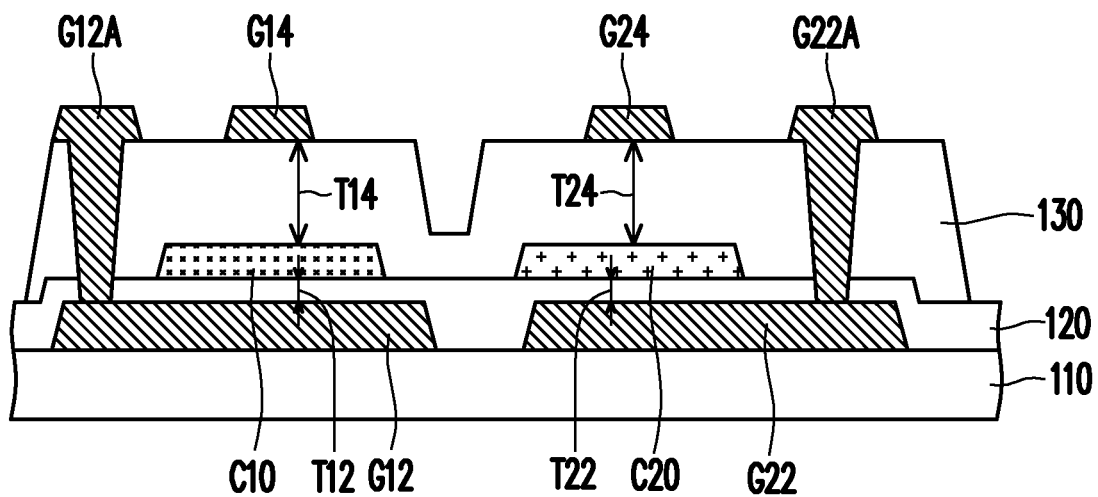

Then, referring to FIG. 2, a second gate insulating layer 130 is formed on the first gate insulating layer 120. The second gate insulating layer 130 covers the switching channel C10 and the driving channel C20. A thickness T14 of the second gate insulating layer 130 is greater than a thickness T12 of the first gate insulating layer 120. Here, the thickness T14 of a part of the second gate insulating layer 130 between the switching bottom gate G12 and the switching channel C10 is compared with the thickness T12 of a part of the first gate insulating layer 120 between the switching bottom gate G12 and the switching channel C10. In the embodiment, the thickness of the first gate insulating layer 120 at different positions is approximately the same, and the thickness of the second gate insulating layer 130 at different positions is also approximately the same, and only a thickness error caused by process factors exists, but the disclosure is not limited thereto. In addition, the thickness in the figure is only schematic, and does not represent the actual thickness.

Then, a switching top gate G14 and a driving top gate G24 are formed on the second gate insulating layer 130. When forming the switching top gate G14 and the driving top gate G24, for example, a conductor layer is comprehensively formed first, and then the conductor layer is patterned to form the switching top gate G14 and the driving top gate G24.

Then, a doping process may be performed so that a part of the switching channel C10 and a part of the driving channel C20 are suitable for connecting electrodes. For example, a part of the driving channel C20 may be doped with phosphorous ions or arsenic ions, and a part of the switching channel C10 may be doped with hydrogen ions, but the disclosure is not limited thereto.

In an embodiment, a doping process may be comprehensively performed so that a part of the switching channel C10 that is not located under the switching top gate G14 is doped with phosphorous ions, and a part of the driving channel C20 that is not located under the driving top gate G24 is doped with phosphorous ions. Then, heating is performed to complete the doping process. Then, hydrogen plasma is comprehensively used to perform another doping process, so that the part of the switching channel C10 that is not located under the switching top gate G14 is doped with hydrogen ions, and to repair the silicon broken bonds of the driving channel C20 with hydrogen ions.

In another embodiment, a mask layer for shielding the switching channel C10 may be formed first, and then the doping process may be comprehensively carried out. At this moment, the switching channel C10 is shielded by the mask layer and will not be doped with phosphorous ions, and the part of the driving channel C20 that is not located under the driving top gate G24 is doped with phosphorous ions. Then, heating is performed to complete the doping process. Then, the aforementioned mask layer is removed, and another doping process is comprehensively performed by using hydrogen plasma, so that the part of the switching channel C10 that is not located under the switching top gate G14 is doped with hydrogen ions, and to repair the silicon broken bonds of the driving channel C20 with hydrogen ions.

In another embodiment, the doping process may be comprehensively performed so that the part of the switching channel C10 that is not located under the switching top gate G14 is doped with phosphorous ions, and the part of the driving channel C20 that is not located under the driving top gate G24 is doped with phosphorous ions. Then, heating is performed to complete the doping process. Then, the mask layer for shielding the switching channel C10 is formed, and then the hydrogen plasma is comprehensively used to perform another doping process. At this moment, the switching channel C10 is shielded by the mask layer and will not be doped with hydrogen ions, and the part of the driving channel C20 is repaired with hydrogen ions.

In another embodiment, phosphorus ions may be comprehensively used to perform the doping process. Then, a silicon hydride nitride (SiNx:H) layer is formed, which is disposed on the second gate insulating layer 130 and covers the switching top gate G14 and the driving top gate G24. Then, heating is performed to complete the doping process. In this way, the part of the switching channel C10 that is not located under the switching top gate G14 can be doped with phosphorus ions and hydrogen ions, and the part of the driving channel C20 that is not located under the driving top gate G24 is doped with phosphorus ions and the part of the driving channel C20 is repaired with hydrogen ions.

Figure 3:
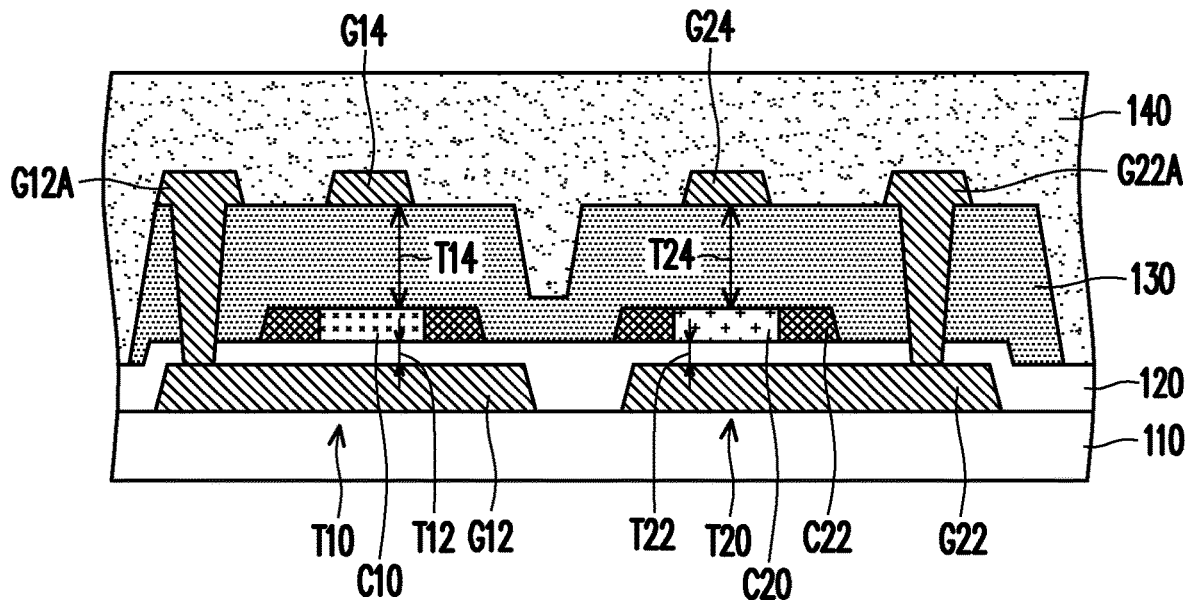

Then, referring to FIG. 3, a passivation layer 140 is selectively formed on the second gate insulating layer 130, where the passivation layer 140 covers the switching top gate G14 and the driving top gate G24. The passivation layer 140 is, for example, an organic flat layer, and a material thereof is, for example, polyester (PET), polyolefin, polypropylene, polycarbonate, polyalkylene oxide, polyphenylene, polyether, polyketone, polyalcohol, polyaldehyde, or other suitable materials, but the disclosure is not limited thereto. The material of the passivation layer 140 may also be silicon hydride nitride or silicon oxide.

Figure 4:
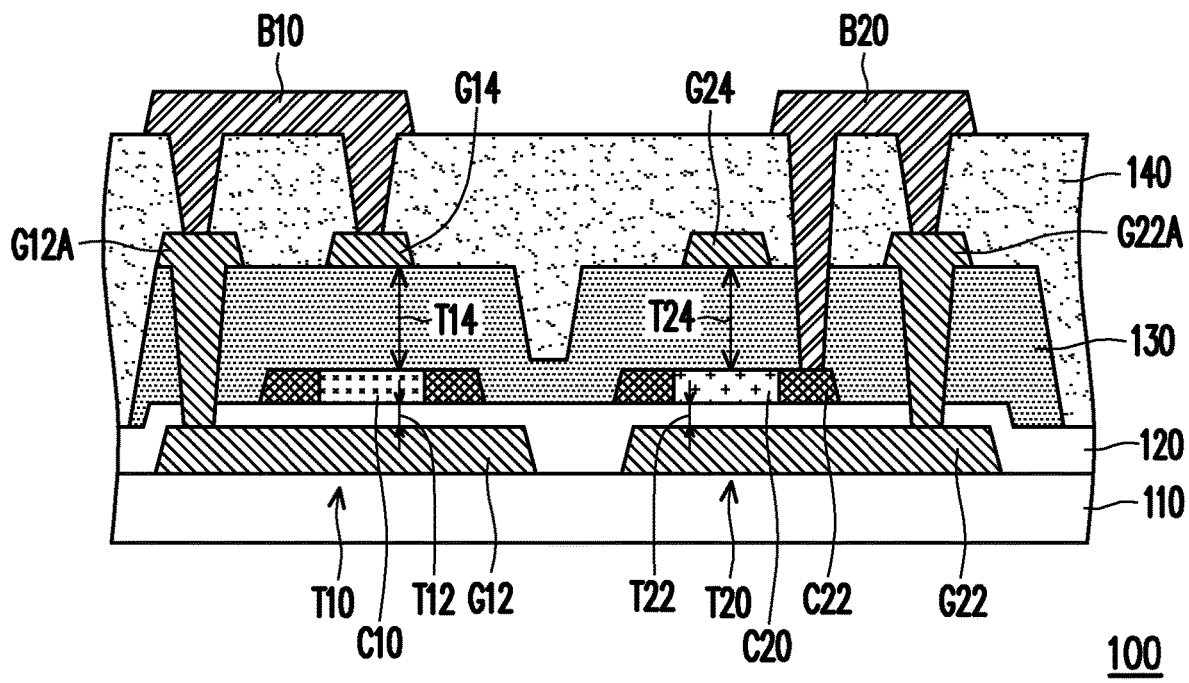

Referring to FIG. 4, the switching top gate G14 is electrically connected to the switching bottom gate G12, and a low potential end C22 of the driving channel C20 is electrically connected to the driving bottom gate G22. In the embodiment, a connecting member B10 and a connecting member B20 penetrating through the passivation layer 140 and partially located in the passivation layer 140 are formed. The connecting member B20 further penetrates through the second gate insulating layer 130. Moreover, in the step of FIG. 2, when the switching top gate G14 and the driving top gate G24 are formed, a connecting member G12A and a connecting member G22A are also formed. Therefore, the switching top gate G14 may be electrically connected to the switching bottom gate G12 through the connecting member B10 and the connecting member G12A, and the low potential end C22 of the driving channel C20 may be electrically connected to the driving bottom gate G22 through the connecting member B20 and the connecting member G22A. Here, although the method of electrically connecting the switching top gate G14 to the switching bottom gate G12 and electrically connecting the low potential end C22 of the driving channel C20 to the driving bottom gate G22 is described as an example, the disclosure is not limited thereto.

Referring to FIG. 4 again, the active element 100 of the embodiment includes the substrate 110, the switching bottom gate G12, the driving bottom gate G22, the first gate insulating layer 120, the switching channel C10, the driving channel C20, the second gate insulating layer 130, the switching top gate G14 and the driving top gate G24. The switching bottom gate G12 and the driving bottom gate G22 are disposed on the substrate 110. The first gate insulating layer 120 is disposed on the substrate 110 and covers the switching bottom gate G12 and the driving bottom gate G22. The switching channel C10 and the driving channel C20 are configured on the first gate insulating layer 120. The driving channel C20 has the low potential end C22. The low potential end C22 is electrically connected to the driving bottom gate G22. The second gate insulating layer 130 is disposed on the first gate insulating layer 120 and covers the switching channel C10 and the driving channel C20. The thickness of the second gate insulating layer 130 is greater than the thickness of the first gate insulating layer 120. The switching top gate G14 and the driving top gate G24 are disposed on the second gate insulating layer 130. The switching top gate G14 is electrically connected to the switching bottom gate G12.

Figure 5:
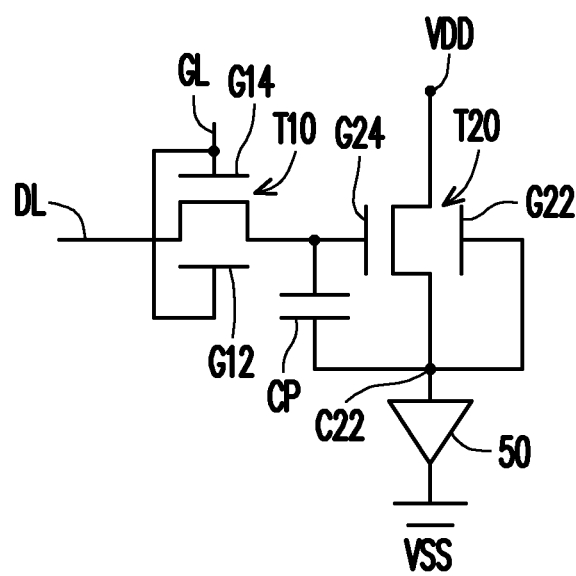
FIG. 5 is a diagram of an equivalent circuit of the active element of FIG. 4.

FIG. 5 is a diagram of an equivalent circuit of the active element of FIG. 4. Referring to FIG. 4 and FIG. 5, the switching bottom gate G12, the switching channel C10 and the switching top gate G14 are a part of a switching element T10, and the driving bottom gate G22, the driving channel C20 and the driving top gate G24 are a part of a driving element T20. A high potential end of the switching channel C10 is electrically connected to a data line DL. A low potential end of the switching channel C10 is electrically connected to the driving top gate G24, and the low potential end of the switching channel C10 is electrically connected to a light-emitting element 50 through a capacitor CP. The switching bottom gate G12 and the switching top gate G14 are electrically connected to a scan line GL. A high potential end of the driving channel C20 is electrically connected to a power supply VDD. The low potential end C22 of the driving channel C20 is electrically connected to the driving bottom gate G22 and the light-emitting element 50. The other end of the light-emitting element 50 is electrically connected to a common circuit VSS.

According to the above description, the driving element T20 has the driving bottom gate G22 and the driving top gate G24, and a subthreshold swing of the driving element T20 of such structure is not obviously changed when the thickness of the first gate insulating layer 120 and the thickness of the second gate insulating layer 130 are changed. Therefore, the subthreshold swing of the driving element T20 may be maintained at a higher state, thereby improving the stability of the light-emitting element 50 at low brightness. In addition, since the thickness T14 of the second gate insulating layer 130 is greater than the thickness T12 of the first gate insulating layer 120, a subthreshold swing of the switching element T10 may be maintained at a low state, thereby improving a turning on/off speed of the light-emitting element 50.

In the embodiment, the thickness T12 of the part of the first gate insulating layer 120 between the switching bottom gate G12 and the switching channel C10 is equal to the thickness T22 of the part of the first gate insulating layer 120 between the driving bottom gate G22 and the driving channel C20. Moreover, in the embodiment, the thickness T14 of the part of the second gate insulating layer 130 between the switching bottom gate G12 and the switching channel C10 is equal to the thickness T24 of the part of the second gate insulating layer 130 between the driving bottom gate G22 and the driving channel C20. Since the thickness of the first gate insulating layer 120 of the embodiment at the above-mentioned different positions is approximately the same, and the thickness of the second gate insulating layer 130 at the above-mentioned different positions is also approximately the same, so that the manufacturing process is relatively simple and the cost is low.

In the embodiment, the active element 100 further includes the passivation layer 140 disposed on the second gate insulating layer 130 and covering the switching top gate G14 and the driving top gate G24.

In the embodiment, the thickness T14 of the second gate insulating layer 130 is formed to be greater than or equal to 4 times of the thickness T12 of the first gate insulating layer 120. For example, the thickness T14 of the second gate insulating layer 130 is formed to be equal to 5 times of the thickness T12 of the first gate insulating layer 120. In this way, the subthreshold swing of the driving top gate G24 of the driving element T20 is increased significantly, while the subthreshold swing of the switching bottom gate G12 of the switching element T10 is not affected.

In summary, in the active element and the manufacturing method thereof of the disclosure, the double gate design reduces the influence of the thickness change of the gate insulating layer of the switching element on the subthreshold swing of the switching element, and the double gate design makes the thickness change of the gate insulating layer of the driving element to be adapted to adjust the subthreshold swing of the driving element. Therefore, the subthreshold swing of the driving element may be increased under a premise of maintaining a low subthreshold swing of the switching element, thereby improving the display quality.

What is claimed is:

1. An active element, comprising:
    a substrate;
    a switching bottom gate and a driving bottom gate, disposed on the substrate;
    a first gate insulating layer, disposed on the substrate and covering the switching bottom gate and the driving bottom gate;
    a switching channel and a driving channel, disposed on the first gate insulating layer, wherein the driving channel has a low potential end, and the low potential end is electrically connected to the driving bottom gate;
    a second gate insulating layer, disposed on the first gate insulating layer and covering the switching channel and the driving channel, wherein a thickness of the second gate insulating layer is greater than a thickness of the first gate insulating layer; and
    a switching top gate and a driving top gate, disposed on the second gate insulating layer, wherein the switching top gate is electrically connected to the switching bottom gate.

2. The active element as claimed in claim 1, wherein the thickness of the second gate insulating layer is greater than or equal to 4 times of the thickness of the first gate insulating layer.

3. The active element as claimed in claim 1, wherein the thickness of the second gate insulating layer is equal to 5 times of the thickness of the first gate insulating layer.

4. The active element as claimed in claim 1, wherein a material of the switching channel is indium-gallium-zinc oxide (IGZO).

5. The active element as claimed in claim 1, wherein a material of the driving channel is low temperature poly-silicon.

6. The active element as claimed in claim 1, wherein a thickness of a part of the first gate insulating layer between the switching bottom gate and the switching channel is equal to a thickness of a part of the first gate insulating layer between the driving bottom gate and the driving channel.

7. The active element as claimed in claim 1, wherein a thickness of a part of the second gate insulating layer between the switching top gate and the switching channel is equal to a thickness of a part of the second gate insulating layer between the driving top gate and the driving channel.

8. The active element as claimed in claim 1, wherein a part of the switching channel is doped with hydrogen ions.

9. The active element as claimed in claim 1, wherein a part of the driving channel is doped with phosphorus ions or arsenic ions.

10. The active element as claimed in claim 1, further comprising a passivation layer disposed on the second gate insulating layer and covering the switching top gate and the driving top gate.

11. A manufacturing method of an active element, comprising:
    forming a switching bottom gate and a driving bottom gate on a substrate;
    forming a first gate insulating layer on the substrate, wherein the first gate insulating layer covers the switching bottom gate and the driving bottom gate;
    forming a switching channel and a driving channel on the first gate insulating layer;
    forming a second gate insulating layer on the first gate insulating layer, wherein the second gate insulating layer covers the switching channel and the driving channel, and a thickness of the second gate insulating layer is greater than a thickness of the first gate insulating layer; and
    forming a switching top gate and a driving top gate on the second gate insulating layer, wherein the switching top gate is electrically connected to the switching bottom gate, and a low potential end of the driving channel is electrically connected to the driving bottom gate.

12. The manufacturing method of the active element as claimed in claim 11, wherein the thickness of the second gate insulating layer is formed to be greater than or equal to 4 times of the thickness of the first gate insulating layer.

13. The manufacturing method of the active element as claimed in claim 11, wherein the thickness of the second gate insulating layer is formed to be equal to 5 times of the thickness of the first gate insulating layer.

14. The manufacturing method of the active element as claimed in claim 11, wherein a material of the switching channel is indium-gallium-zinc oxide (IGZO).

15. The manufacturing method of the active element as claimed in claim 11, wherein a material of the driving channel is low temperature poly-silicon.

16. The manufacturing method of the active element as claimed in claim 11, wherein a thickness of a part of the first gate insulating layer between the switching bottom gate and the switching channel is formed to be equal to a thickness of a part of the first gate insulating layer between the driving bottom gate and the driving channel.

17. The manufacturing method of the active element as claimed in claim 11, wherein a thickness of a part of the second gate insulating layer between the switching top gate and the switching channel is equal to a thickness of a part of the second gate insulating layer between the driving top gate and the driving channel.

18. The manufacturing method of the active element as claimed in claim 11, further comprising:
    performing a doping process to dope a part of the switching channel with hydrogen ions after forming the switching top gate and the driving top gate.

19. The manufacturing method of the active element as claimed in claim 11, further comprising:
    performing a doping process to dope a part of the driving channel with phosphorus ions or arsenic ions after forming the switching top gate and the driving top gate.

20. The manufacturing method of the active element as claimed in claim 11, further comprising:
    forming a passivation layer on the second gate insulating layer after forming the switching top gate and the driving top gate, wherein the passivation layer covers the switching top gate and the driving top gate.

* * * * *